US009502212B2

(12) United States Patent
Mizuhara et al.

(10) Patent No.: US 9,502,212 B2
(45) Date of Patent: Nov. 22, 2016

(54) CHARGED PARTICLE BEAM APPARATUS

(71) Applicant: Hitachi High-Technologies Corporation, Minato-ku, Tokyo (JP)

(72) Inventors: Yuzuru Mizuhara, Tokyo (JP); Miki Isawa, Tokyo (JP); Minoru Yamazaki, Tokyo (JP); Hitoshi Tamura, Tokyo (JP); Hideyuki Kazumi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/760,259

(22) PCT Filed: Jan. 22, 2014

(86) PCT No.: PCT/JP2014/051171
§ 371 (c)(1),
(2) Date: Jul. 10, 2015

(87) PCT Pub. No.: WO2014/115741
PCT Pub. Date: Jul. 31, 2014

(65) Prior Publication Data
US 2015/0348748 A1 Dec. 3, 2015

(30) Foreign Application Priority Data

Jan. 23, 2013 (JP) .................. 2013-009734

(51) Int. Cl.
*H01J 37/26* (2006.01)
*H01J 37/147* (2006.01)
(Continued)

(52) U.S. Cl.
CPC .......... *H01J 37/268* (2013.01); *H01J 37/1472* (2013.01); *H01J 37/244* (2013.01);
(Continued)

(58) Field of Classification Search
CPC .. H01J 37/244; H01J 37/1472; H01J 37/265; H01J 37/28; H01J 37/266; H01J 37/268; H01J 37/29; H01J 37/292; H01J 2237/24564; H01J 2237/28; H01J 2237/2809; H01J 2237/2806
See application file for complete search history.

(56) References Cited

U.S. PATENT DOCUMENTS 4,807,159 A * 2/1989 Komatsu ............ G01R 31/305
250/311
6,521,891 B1 2/2003 Dotan et al.
(Continued)

FOREIGN PATENT DOCUMENTS

JP 4-229541 A 8/1992
JP 10-125271 A 5/1998
(Continued)

OTHER PUBLICATIONS

International Search Report (PCT/ISA/210) dated Mar. 18, 2014, with English translation (four (4) pages).

*Primary Examiner* — Jack Berman
(74) *Attorney, Agent, or Firm* — Crowell & Moring LLP

(57) ABSTRACT

An object of the present invention is to provide a method and an apparatus capable of measuring a potential of a sample surface by using a charged particle beam, or of detecting a compensation value of a variation in an apparatus condition which changes due to sample charging, by measuring a sample potential caused by irradiation with the charged particle beam. In order to achieve the object, a method and an apparatus are provided in which charged particle beams (2(*a*), 2(*b*)) emitted from a sample (23) are deflected by a charged particle deflector (33) in a state in which the sample (23) is irradiated with a charged particle beam (1), and information regarding a sample potential is detected by using a signal obtained at that time.

10 Claims, 4 Drawing Sheets

(51) Int. Cl.
*H01J 37/244* (2006.01)
*H01J 37/28* (2006.01)

(52) U.S. Cl.
CPC .......... *H01J 37/265* (2013.01); *H01J 37/266* (2013.01); *H01J 37/28* (2013.01); *H01J 2237/24564* (2013.01); *H01J 2237/28* (2013.01); *H01J 2237/2809* (2013.01)

(56) References Cited

U.S. PATENT DOCUMENTS

| | | | |
|---|---|---|---|
| 7,459,681 B2 * | 12/2008 | Arai | H01J 37/026 250/306 |
| 7,851,756 B2 * | 12/2010 | Fukaya | H01J 37/026 250/307 |
| 8,153,966 B2 * | 4/2012 | Arai | H01J 3/027 250/251 |
| 8,263,934 B2 | 9/2012 | Yamazaki et al. | |
| 9,058,959 B2 * | 6/2015 | Kawanami | H01J 37/20 |
| 2002/0024021 A1 | 2/2002 | Iwabuchi et al. | |
| 2009/0039264 A1 | 2/2009 | Ikegami et al. | |

FOREIGN PATENT DOCUMENTS

| | | |
|---|---|---|
| JP | 2000-223542 A | 8/2000 |
| JP | 2001-93950 A | 4/2001 |
| JP | 2001-236915 A | 8/2001 |
| JP | 2008-153085 A | 7/2008 |
| JP | 2009-43936 A | 2/2009 |
| JP | 2010-40461 A | 2/2010 |

* cited by examiner

WHITE POINT

BLACK POINT

GLOBAL CHARGING RELATIVE TO ΔR

LOCAL CHARGING RELATIVE TO Δφ

RELATIONSHIP BETWEEN INCIDENCE ENERGY AND
MOVEMENT AMOUNT

RELATIONSHIP BETWEEN INCIDENCE ENERGY AND
MOVEMENT DIRECTION

CHARGED PARTICLE BEAM APPARATUS

TECHNICAL FIELD

The present invention relates to a charged particle beam detection method and a charged particle beam apparatus, and particularly to a sample potential information detection method suitable for measuring a sample potential, and a charged particle beam apparatus which detects a sample potential.

BACKGROUND ART

In recent years, with the advance of a semiconductor device, measurement and inspection techniques of a semiconductor have become important more and more. A scanning electron microscope which is typified by a critical dimension-scanning electron microscope (CD-SEM) is an apparatus which scans a sample with electron beams, and detects electrons such as secondary electrons emitted from the sample so that a pattern formed on a semiconductor device is measured. In order to perform highly accurate measurement and inspection in such an apparatus, it is necessary to set appropriate conditions of the apparatus, but, among recent devices, there are samples which are charged due to irradiation with electron beams or due to an influence of a semiconductor process. Particularly, insulating samples such as a resist, an insulating film, and a low-k material are known as samples which are easily charged.

If a sample is charged, a trajectory of an electron may be bent, and this causes astigmatism or an image blur. PTLs 1 to 4 disclose techniques in which a charging amount is measured, and a state of an apparatus is controlled on the basis of the information in order to appropriately focus on such a charged sample. PTLs 1 to 3 disclose scanning electron microscopes which cancel an influence of charging on a sample by adjusting a voltage applied to the sample. In addition, PTL 4 discloses a method in which a voltage applied to a sample is made higher than an acceleration voltage of an electron beam so that the electron beam does not reach the sample but is reflected therefrom, and a sample potential is detected on the basis of an electron which is obtained by using the reflected electron beam.

CITATION LIST

Patent Literature

PTL 1: JP-A-4-229541
PTL 2: JP-A-10-125271
PTL 3: JP-A-2001-236915 (corresponding U.S. Pat. No. 6,521,891)
PTL 4: JP-A-2008-153085 (corresponding U.S. Pat. No. 8,263,934)

SUMMARY OF INVENTION

Technical Problem

In the techniques disclosed in PTLs 1 to 3, a sample potential is measured in a state in which the charged particle beam reaches the sample, and in the technique disclosed in PTL 4, a sample potential is measured in a state in which the charged particle beam does not reach the sample. All the techniques relate to a method of measuring a charging amount while minimizing charging and of adjusting apparatus conditions on the basis of a measurement result.

However, among recent devices, there is a sample whose observation is possible only when potential contrast is formed by irradiating the sample with a charged particle beam of large current so as to cause an intentional charging state. Since such a sample is required to be positively charged, a technique of measuring a charging amount under a charging situation is essential.

In addition, the charging may be roughly classified into global charging indicating wide charging which reaches the entire sample, and local charging corresponding to a local charging amount which is limited to a region irradiated with a charged particle beam. An apparatus can be controlled with higher accuracy by obtaining information regarding both of the global charging and the local charging, but, in the techniques disclosed in PTLs 1 to 4, it is difficult to measure both of the global charging and the local charging in a sample in which violent charging occurs.

Further, there is a need for a method of measuring charging with high accuracy, which has not been present in the related art. Hereinafter, a description will be made of a charged particle beam apparatus whose object is to measure sample charging with higher accuracy. Furthermore, a description will be made of a charged particle beam apparatus whose another object is to measure both global charging and local charging.

Solution to Problem

In an aspect for achieving the object, there is a provided a charged particle beam apparatus including a deflector which deflects a charged particle from a sample side toward an electron source side, in which a sample potential or an adjustment parameter for the charged particle beam apparatus is obtained on the basis of a movement amount of the charged particle deflected by the deflector, or a movement amount of a display object in an image which is formed by using the charged particle.

In addition, in another aspect for achieving another object, there is provided a charged particle beam apparatus which deflects a secondary electron generated from a sample when irradiating the sample with a charged particle beam, and obtains a movement amount and a movement direction of the secondary electron at that time, or a movement amount and a movement direction of a display object in an image which is formed by using the secondary electron, so as to obtain information regarding a sample potential.

Advantageous Effects of Invention

According to the aspect, it is possible to measure charging or to adjust an apparatus with high accuracy. In addition, according to another aspect, it is possible to measure both global charging and local charging.

DESCRIPTION OF EMBODIMENTS

Figure 1:
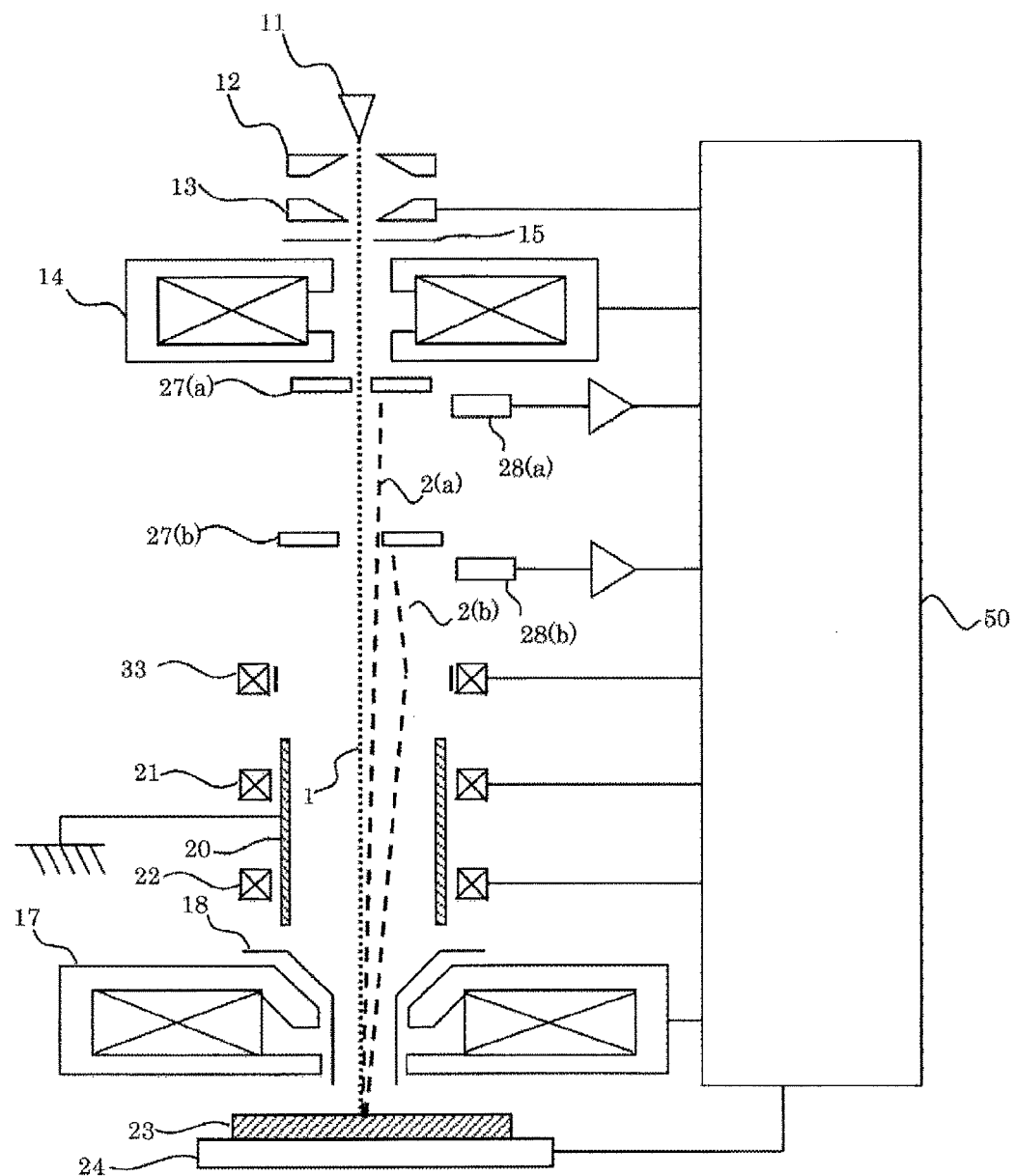
FIG. 1 is a diagram illustrating a configuration of a scanning electron microscope.

In recent years, micronization or high integration of a ULSI element has rapidly progressed, and thus device processing in which a processing dimension is several of tens of nm has been performed. In addition, in order to increase a processing speed, a low dielectric constant film or a metal gate film has been employed, or generation of multiple layers has progressed by using various kinds of new materials such as a three-layer resist for increasing etching resistance. Therefore, there is a request for strict dimensional accuracy (CD) management during ULSI processing.

An insulator such as a resist, an insulating film, or a low-k material is frequently used in a semiconductor processing step, but a surface of the insulator is charged due to irradiation with an electron beam. If the surface thereof is charged, this changes an amount of secondary electrons which intend to escape from the sample surface, or bends a trajectory of a primary electron beam, and thus an image obtained by the scanning electron microscope is distorted. As a result, it is hard to measure a true processing dimension or a shape. For example, in an ArF resist, it cannot be determined whether line edge roughness (LER) occurs due to an etching step, or a dimension is wrongly measured due to charging of the sample. Further, in observation of a high aspect contact hole, there is the occurrence of a problem that a shape of the contact hole is distorted and observed, or an upper diameter and a lower diameter of the hole are hard to identify.

The charging includes not only a spatial change caused by movement or diffusion of electrons but also a temporal change caused by attenuation due to recombination of holes and electrons or the like. In addition, the sample surface is charged to positive or is charged to negative by energy of an electron which is incident thereto. Therefore, it is important to control the charging. As a result of a trajectory of an electron being bent by the charging, astigmatism or an image blur occurs. An automatic focus function of focusing electrons at a predetermined position also has a problem such as deviation from an original focus position due to charging, and time for focusing is prolonged, and thus it is important to identify a size or a distribution of charging potential.

The suppression of the charging is important, but, on the contrary, among recent devices, there is a sample whose observation is possible only when potential contrast is formed by irradiating the sample with a charged particle beam of large current so as to cause an intentional charging state. Since such a sample is required to be positively charged, a technique of measuring a charging amount under a violent charging situation is essential.

The charging may be roughly classified into global charging corresponding to averaging of charging amounts in a wide range, and local charging corresponding to a local charging amount which is limited to a region irradiated with a charged particle beam. An apparatus can be controlled with higher accuracy by obtaining information regarding both of the global charging and the local charging.

In embodiments described below, a description will be made of a method and an apparatus capable of measuring charging of a wide region and a local region which contribute to forming of an image regardless of a sample potential induced by irradiation with charged particle beams.

FIG. 1 is a diagram illustrating a configuration of a scanning electron microscope. In addition, in the following description, a scanning electron microscope (SEM) which scans a sample with electron beams will be described as an example, but the embodiments are not limited thereto, and are also applicable to other charged particle beam apparatuses such as a focused ion beam (FIB) apparatus. Further, FIG. 1 illustrates only an example of the scanning electron microscope, and the embodiments described below in detail are applicable to scanning electron microscopes having configurations which are different from the configuration illustrated in FIG. 1 without departing from the spirit of the invention.

In the scanning electron microscope illustrated in FIG. 1, an extraction voltage is applied between a field emission cathode 11 and an extraction electrode 12 and thus a primary electron beam is extracted.

The primary electron beam 1 extracted in this way is accelerated by an acceleration electrode 13, and is focused by a condenser lens 14 and is subjected to scanning deflection by an upper scanning deflector 21 and a lower scanning deflector 22. An objective aperture 15 which controls the intensity of the primary electron beam 1 and an opening angle is disposed between the acceleration electrode 13 and the condenser lens 14. The deflection intensity of the upper scanning deflector 21 and the lower scanning deflector 22 is adjusted so that a sample 23 which is set in a holder 24 with a lens center of an objective lens 17 as a fulcrum is two-dimensionally scanned.

The deflected primary electron beam 1 is accelerated by an acceleration cylinder 18 provided in a passage of the objective lens 17 and further by an acceleration voltage in the rear stage. The primary electron beam 1 which is accelerated in the rear stage is narrowed by lens action of the objective lens 17. A tubular cylinder 20 is grounded and forms an electric field for accelerating the primary electron beam 1 along with the acceleration cylinder 18.

Electrons such as secondary electrons or backscattered electrons emitted from the sample are accelerated in a direction opposite to the irradiation direction of the primary electron beam 1 by a negative voltage (retarding voltage) applied to the sample and an electric field formed in the acceleration cylinder 18. A secondary electron 2(a) which collides with an upper reflection plate 27(a) and a secondary electron 2(b) which collides with a lower reflection plate 27(b) are converted into ternary electrons, and the ternary electrons are guided to an upper detector 28(a) or a lower detector 28(b) so that an SEM image is formed. The upper reflection plate 27(a) and the lower reflection plate 27(b) are disposed between the objective lens 17 and the condenser lens 14.

Holes are formed in the upper reflection plate 27(a) and the lower reflection plate 27(b), but the hole of the lower reflection plate 27(b) has a function of restricting an amount of the secondary electrons to be detected and a detection region (secondary electron aperture).

In the upper detector 28(a), only a secondary electron which passes through the secondary electron aperture of the lower reflection plate 27(b) is detected so as to form an SEM image. In the lower detector 28(b), a ternary electron generated by the secondary electron which collides with the lower reflection plate 27(b) is detected so as to form an SEM image.

A secondary electron deflector 33 which deflects the secondary electron is disposed between the objective lens 17 and the lower reflection plate 27(b). The secondary electron deflector has a function of a Wien filter so as not to deflect the primary electron and to deflect only the secondary electron. The Wien filter is constituted of an electrode and a magnetic pole which cause deflection in four directions which are perpendicular to each other.

The electron detected in the upper detector 28(a) or the lower detector 28(b) is displayed on an image display apparatus (not illustrated) in synchronization with scanning signals supplied to the upper scanning deflector 21 and the lower scanning deflector 22. In addition, an obtained image is stored in a frame memory (not illustrated) provided in a controller 50. The controller 50 measures a sample potential based on a calculation expression as described later by using the obtained image. In addition, in a case where a beam condition (a scanning signal, a retarding voltage, or the like) is adjusted not depending on a sample potential but depending on a variation in the sample potential, calculation may be performed by using a calculation expression which allows an adjustment parameter to be a calculation result. A processor which executes such calculation is built into the controller 50. Further, not a calculation expression but a table expressing a relationship between a potential or the like and a movement amount may be prepared, and a potential or an adjustment parameter may be derived. Still further, a current or a voltage supplied and applied to each constituent element of the scanning electron microscope illustrated in FIG. 1 may be controlled by using a controller which is provided separately from the scanning electron microscope body.

Embodiment 1

In the present embodiment, a secondary electron deflector including a Wien filter which does not deflect a charged particle beam emitted from a charged particle source and deflects only a secondary electron emitted from a sample is mounted between the charged particle source and an objective lens which focuses the charged particle beam. A description will be made of a method and an apparatus in which a secondary electron deflected by applying a voltage and a current to the secondary electron deflector is caused to pass through or to collide with a secondary electron aperture disposed between the charged particle source and the secondary electron deflector so that an image using the secondary electron is acquired, and a sample potential is obtained on the basis of the secondary electron image.

According to this apparatus configuration, it is possible to simultaneously and easily measure global charging (first charging information) and local charging (second charging information) in a charging state in which irradiation with a charged particle beam is performed through comparison of an amount of deflection and a deflection direction of a secondary electron in an uncharged sample. In addition, it is possible to easily determine an incidence energy condition of a charged particle beam which does not cause charging.

Hereinafter, a description will be made of a method of measuring a sample potential by using an electron beam, and an apparatus for realizing the method.

Figure 2A:
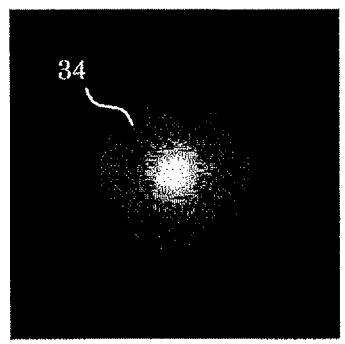
FIGS. 2A and 2B illustrate a white point image and a black point image which are formed on the basis of detection of a secondary electron, or detection of a secondary electron which is generated as a result of the secondary electron colliding with a structure of the scanning electron microscope.

An SEM image with a low magnification can be formed by increasing amounts of scanning deflection in the upper scanning deflector 21 and the lower scanning deflector 22. At the low magnification, a white point image as illustrated in FIG. 2(a) can be obtained in the upper detector 28(a). A white point 34 is formed by a secondary electron which has passed through the hole (secondary electron aperture) of the lower reflection plate 27(b).

Figure 2B:
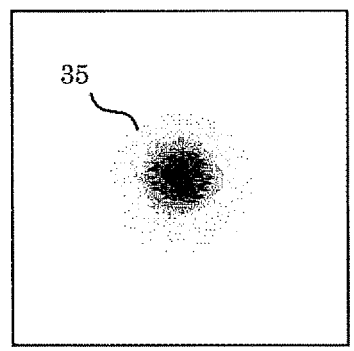

On the other hand, since a secondary electron which has passed through the lower reflection plate 27(b) is not detected in the lower detector 28(b), a black point image as illustrated in FIG. 2(b) is obtained. A diameter of the white point 34 or a black point 35 corresponds to a hole diameter of the lower reflection plate 27(b).

A voltage is applied to an electrode of the secondary electron deflector 33 in a state in which the white point 34 or the black point 35 is observed. The magnitude of the applied voltage may be any value as long as the white point 34 or the black point 35 does not exceed an SEM screen. If currents satisfying a Wien condition are simultaneously applied to coils as the magnetic poles of the secondary electron deflector 33, the primary electron beam 1 goes straight without being deflected, and only the secondary electrons 2(a) and 2(b) are deflected.

Either of the white point 34 and the black point 35 may be selected as an observation target for measuring a sample potential. Hereinafter, the black point 35 will be described as an example.

Figure 3:
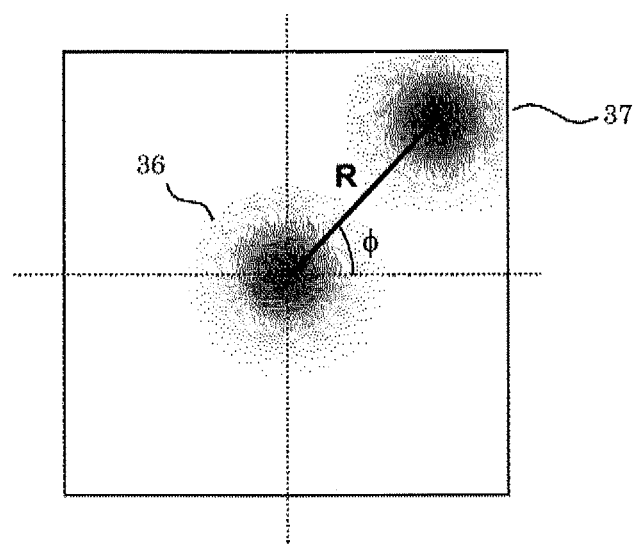
FIG. 3 is a diagram illustrating a state in which a black point moves due to deflection of the secondary electron.

As a result of the secondary electron 2(b) being deflected by the secondary electron deflector 33, as illustrated in FIG. 3, the black point 35 moves to a deflected position 37 from an initial position 36. If a movement amount of the black point 35 is denoted by R, and an angle of a movement direction is denoted by $\phi$, a movement vector of the black point 35 can be defined when a certain voltage is applied to the secondary electron deflector 33, and a sample potential is determined on the basis of the movement vector.

The movement amount R of the black point 35 depends on a speed at which the secondary electron 2(b) passes through the secondary electron deflector 33. If the speed is high, the movement amount R decreases, and if the speed is low, the movement amount R increases.

The speed of the secondary electron (b) depends on a sample potential. If the sample potential increases to positive, the speed decreases, and if the sample potential increases to negative, the speed increases. In other words, the speed of the secondary electron 2(b) decreases if the sample is charged to positive and increases if the sample is charged to negative.

The movement amount R of the black point corresponds to a potential of the sample surface, but a trajectory of the secondary electron is spread more widely than the charged particle beam irradiation region, and thus the speed of the secondary electron is influenced by a wide potential distribution. In other words, the movement amount R of the black point 35 reflects a global charging amount.

Figure 4:
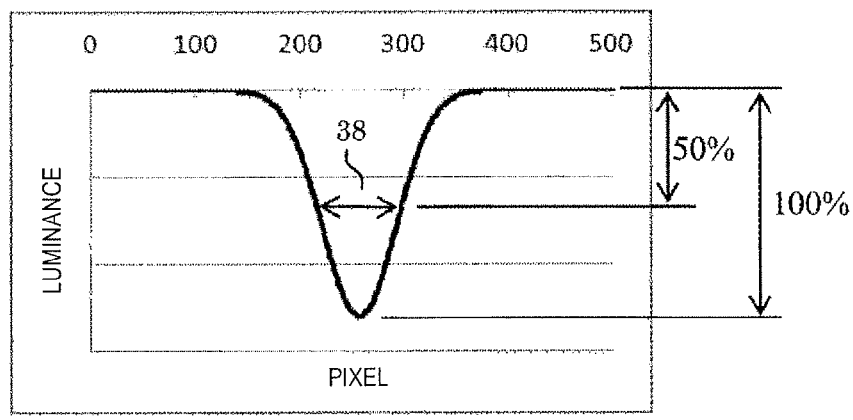
FIG. 4 is a diagram illustrating a method of calculating a movement distance of the black point.

When the movement amount R is converted from the pixel unit into the distance unit, a hole diameter $D_{SE}$ [mm] of the secondary electron aperture (the lower reflection plate 27(b)) corresponds to the diameter of the black point 35. Therefore, as illustrated in FIG. 4, a line profile of the black point 35 may be taken, and a half-value width (38) $D_{BP}$ [pixel] in the pixel unit may be made to correspond to the hole diameter $D_{SE}$ [mm] so that the movement amount is converted from the pixel unit into the distance unit. A distance P per pixel is obtained from $P=D_{SE}/D_{BP}$ [mm/pixel].

In addition, the movement direction $\phi$ of the black point 35 depends on a rotation amount in which the secondary electron 2(b) passes through the secondary electron deflector 33. The secondary electron 2(b) rotates due to a magnetic field lens effect of the objective lens 17 or an electrostatic lens effect of the acceleration cylinder 18. Since the rotation amount depends on a speed of the secondary electron when the lens action is given, and the rotation amount depends on a sample potential.

The rotation amount of the secondary electron depends on a potential of the region which emits the secondary electron. If a potential locally changes due to a structure such as a minute pattern, the rotation amount also changes. Therefore, the movement direction φ of the black point 35 reflects a local charging amount.

Since the movement vector of the white point 34 or the black point 35 is obtained as mentioned above, it is possible to simultaneously and easily detect information regarding the global charging and the local charging.

As described above, according to the present method, since a sample potential is detected by using an image with a low magnification, formed by the secondary electron, there is little influence of distortion of the primary electron due to an influence of charging. Therefore, even in a case where charging is violent, it is possible to stably measure a sample potential.

If a global charging amount and a local charging amount are to be quantitatively determined in any charged sample, an uncharged sample, and an insulator sample such as a solid film wafer in which charging is easily measured are used, and a relationship between movement vectors of white points or black points of both of the samples is obtained.

If a movement amount and a sample potential in the uncharged sample are respectively denoted by $R_{NC}$ and $V_{NC}$, and a movement amount and a sample potential in the charged sample are respectively denoted by $R_C$ and $V_C$, it is possible to obtain a movement amount $\Delta R$ which increases per potential increase of 1 V of the charged sample from $(R_C-R_C)/(V_C-V_{NC})$.

In addition, if a movement angle in the uncharged sample is denoted by $\phi_{NC}$, and a movement angle in the charged sample is denoted by $\phi_C$, it is possible to obtain a rotation amount $\Delta\phi$ which increases per potential increase of 1 V of the charged sample from $(\phi_C-\phi_{NC})/(V_C-V_{NC})$.

Figure 5A:
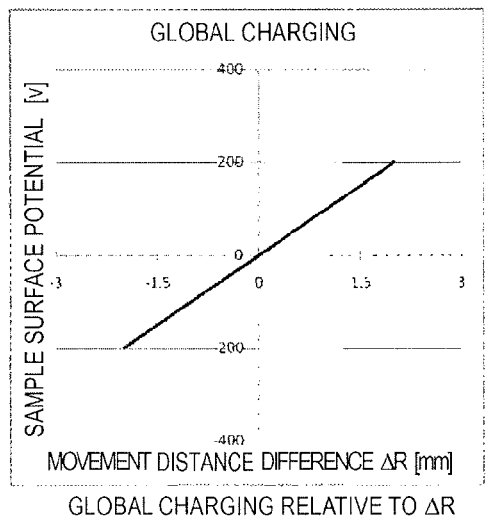
FIGS. 5A and 5B illustrate a method of measuring a global charging amount and a local charging amount (Embodiment 1).
Figure 5B:
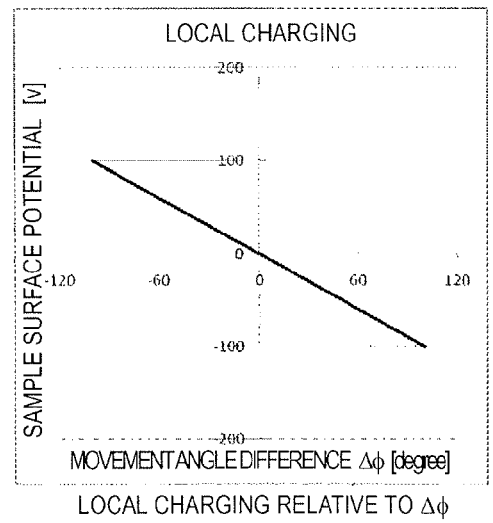

As mentioned above, if a movement vector of a white point or a black point of any charged sample is obtained, as illustrated in FIGS. 5(a) and 5(b), values of global charging and local charging corresponding to $\Delta R$ and $\Delta\phi$ of any charged sample can be quantitatively obtained.

In addition, by preparing a table of $\Delta R$, $\Delta\phi$, and a charging amount, a global charging amount and a local charging amount can also be easily determined in any charged sample if a movement vector of a white point or a black point has only to be measured.

Embodiment 2

If the present method is further used, it is possible to determine incidence energy of the primary electron beam which does not cause charging in any charged sample. Therefore, it is possible to easily set an apparatus state which does not cause charging.

Figure 6A:
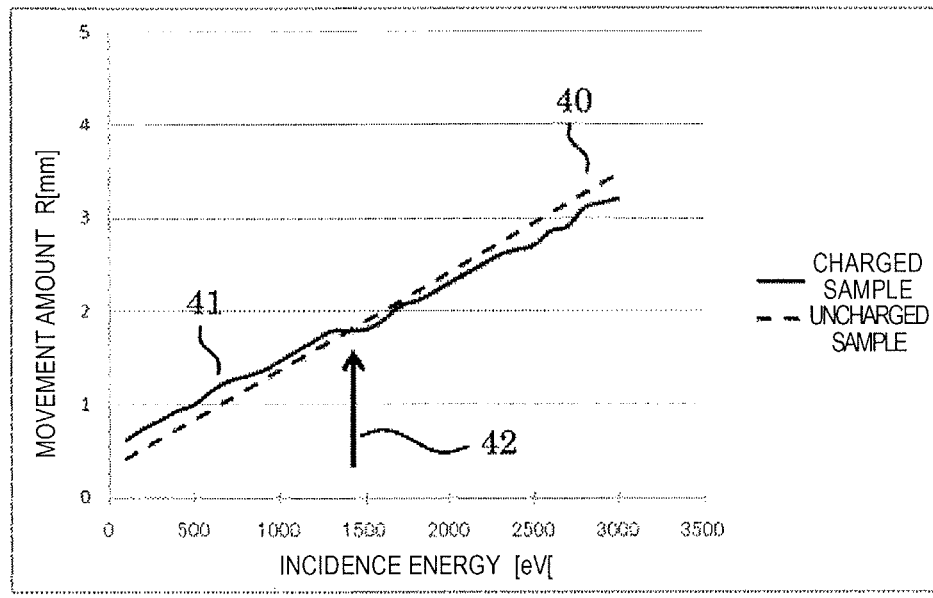
FIGS. 6A and 6B illustrate a method of determining incidence energy which does not cause global charging and incidence energy which does not cause local charging (Embodiment 2).

In an uncharged sample and a charged sample, incidence energy-dependency of a white point or a black point is obtained. FIG. 6(a) is a plot of a movement amount of a black point or a white point relative to incidence energy of the primary electron beam, and FIG. 6(b) is a plot of a movement direction relative to incidence energy.

The reference numeral 40 in FIG. 6(a) indicates the incidence energy-dependency of a movement amount in an uncharged sample, and, in contrast, the reference numeral 41 in FIG. 6(a) indicates the incidence energy-dependency of a movement amount in a charged sample. In the example illustrated here, both of the two match each other in the incidence energy indicated by the reference numeral 42 in FIG. 6(a). This indicates that the charged sample has the same global charging amount as that of the uncharged sample in the incidence energy. In other words, global charging which is in a wide range does not occur in the incidence energy indicated by the reference numeral 42.

Figure 6B:
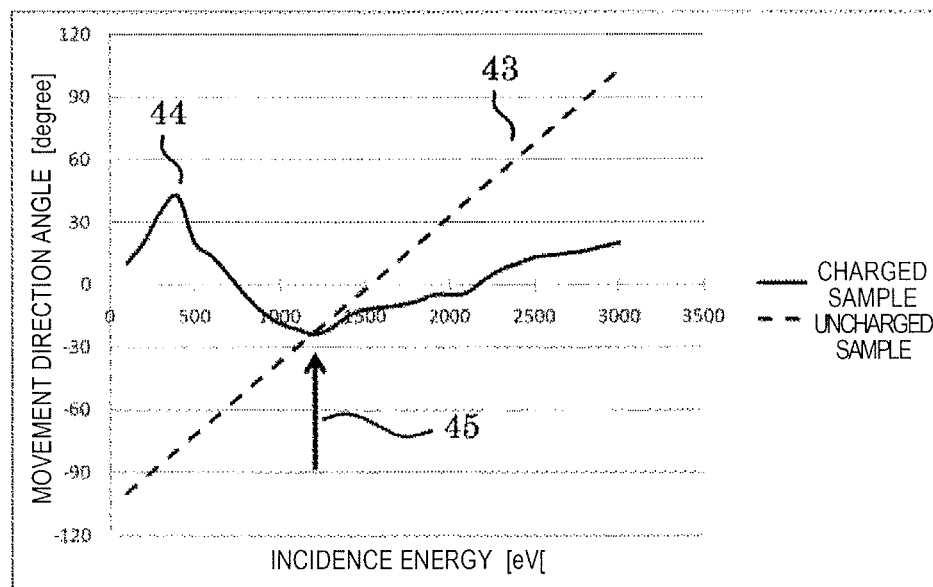

On the other hand, the reference numerals 43 and 44 in FIG. 6(b) respectively indicate incidence energy-dependency of movement directions in the uncharged sample and the charged sample. Herein, both of the two match each other in the incidence energy indicated by the reference numeral 45 in FIG. 6(b), and local charging does not occur in the incidence energy indicated by the reference numeral 45.

As indicated by the reference numeral 42 in FIG. 6(a) and the reference numeral 45 in FIG. 6(b), the incidence energy in which the global charging does not occur and the incidence energy in which the local charging does not occur do not necessarily match each other. This is because the global charging considerably depends on the kind of insulator material, but the local charging considerably depends on a pattern of an irradiation region even in the same insulator material.

As described above, according to the present method, it is possible to easily determine incidence energy which does not cause charging, and also to separately measure incidence energy which does not cause the global charging and incidence energy which does not cause the local charging.

Since greater contribute to contrast of a SEM image of the global charging and the local charging differs depending on a sample, a user may select which charging is restricted by using a sample, and may set incidence energy corresponding thereto.

Embodiment 3

In the present embodiment, a description will be made of an example in which a negative voltage applied to a sample is made higher than a voltage applied to the acceleration electrode 13 so that the primary electron beam 1 (electron beam) does not come into contact with the sample, and then a sample potential is measured. The controller 50 sets a voltage Vr applied to the holder 24 or the sample 23 to be higher than a voltage Vo applied between the acceleration electrode 13 and the field emission cathode 11. In this state, the secondary electron deflector 33 deflects an electron which is directed toward the electron source (the field emission cathode 11) from the sample side, and a sample potential is measured on the basis of the deflection. In the present embodiment, the sample is not irradiated with an electron beam, and a secondary electron is not generated. On the other hand, the electron beam is reflected without reaching the sample due to an electric field formed on the sample. In the present embodiment, this electron is defined as a mirror electron. In other words, in the present embodiment, the secondary electron deflector 33 is a mirror electron deflector.

In the present embodiment, since the sample is not irradiated with the electron beam, the effect of measuring both of the global charging and the local charging cannot be expected unlike in Embodiment 1. On the other hand, it is possible to evaluate the global charging with high accuracy without the local charging. Particularly, since a mirror electron is deflected and thus a displacement thereof on an image caused by charging is enlarged, a sample potential can be measured with high accuracy. In a case of Embodiment 1, a minute displacement is enlarged by deflection, and thus it is possible to measure the global charging and the local charging with high accuracy.

In addition, in the above-described embodiments, a description has been made of an example in which a movement amount (a movement amount of a display object) on an image of the opening of the reflection plate (a secondary charged particle generation member) is measured, the invention is not limited thereto, and, for example, on the basis of an image of another structure (for example, a mesh electrode for an energy filter, or another electron beam opening which is different from the reflection plate) of the electron microscope located on a trajectory of a secondary electron or a mirror electron, a movement amount of the structure may be obtained. Further, in the above-described embodiments, a description has been made of an example in which a secondary electron or a reflected electron is temporarily made to collide with the reflection plate, and a secondary electron emitted from the reflection plate is detected, the invention is not limited thereto, and a detector which directly detects the secondary electron or the reflected electron may be disposed on a trajectory of the electron. Still further, by preparing a detector in which a plurality of detection elements are arranged, not a movement amount of a structure in an image but a movement amount of a trajectory of a secondary electron or a mirror electron may be obtained.

REFERENCE SIGNS LIST

1 PRIMARY ELECTRON BEAM
2(a) SECONDARY ELECTRON
2(b) SECONDARY ELECTRON
11 FIELD EMISSION CATHODE
12 EXTRACTION ELECTRODE
13 ACCELERATION ELECTRODE
14 CONDENSER LENS
15 OBJECTIVE APERTURE
17 OBJECTIVE LENS
18 ACCELERATION CYLINDER
20 TUBULAR CYLINDER
21 UPPER SCANNING DEFLECTOR
22 LOWER SCANNING DEFLECTOR
23 SAMPLE
24 HOLDER
27(a) UPPER REFLECTION PLATE
27(b) LOWER REFLECTION PLATE
28(a) UPPER DETECTOR
28(b) LOWER DETECTOR
34 WHITE POINT
35 BLACK POINT
36 INITIAL POSITION OF BLACK POINT
37 BLACK POINT POSITION AFTER SECONDARY ELECTRON IS DEFLECTED
38 NUMBER OF PIXELS CORRESPONDING TO HOLE DIAMETER OF LOWER REFLECTION PLATE (SECONDARY ELECTRON APERTURE)
40 INCIDENCE ENERGY-DEPENDENCY OF MOVEMENT AMOUNT OF BLACK POINT (WHITE POINT) IN UNCHARGED SAMPLE
41 INCIDENCE ENERGY-DEPENDENCY OF MOVEMENT AMOUNT OF BLACK POINT (WHITE POINT) IN CHARGED SAMPLE
42 INCIDENCE ENERGY WHICH DOES NOT CAUSE GLOBAL CHARGING
43 INCIDENCE ENERGY-DEPENDENCY OF MOVEMENT DIRECTION OF BLACK POINT (WHITE POINT) IN UNCHARGED SAMPLE
44 INCIDENCE ENERGY-DEPENDENCY OF MOVEMENT DIRECTION OF BLACK POINT (WHITE POINT) IN CHARGED SAMPLE
45 INCIDENCE ENERGY WHICH DOES NOT CAUSE LOCAL CHARGING
50 CONTROLLER

The invention claimed is:

1. A charged particle beam apparatus comprising:
a detector that detects a charged particle which is emitted from a sample due to irradiation with a charged particle beam emitted from a charged particle source, or detects a charged particle emitted when the charged particle emitted from the sample collides with a secondary charged particle generation member;
a deflector that deflects a charged particle directed toward the charged particle source side from the sample side in a state in which the charged particle beam emitted from the charged particle source is applied to the sample; and
a controller that obtains a sample potential on the basis of a movement amount of the charged particle deflected by the deflector, or a movement amount of a display object in an image which is formed by using the charged particle.

2. The charged particle beam apparatus according to claim 1,
wherein the deflector performs deflection using an electric field and deflection using a magnetic field.

3. The charged particle beam apparatus according to claim 1,
wherein the secondary charged particle generation member is disposed between the charged particle source and the deflector, and includes an opening through which some charged particles or all charged particles directed toward the charged particle source side from the sample side pass.

4. The charged particle beam apparatus according to claim 1,
wherein a movement amount of a charged particle directed toward the charged particle source side from the sample side, or a movement amount of the display object in the image is information regarding an arrival position on the detector which detects the charged particle, or an arrival position on the secondary charged particle generation member.

5. The charged particle beam apparatus according to claim 1,
wherein the deflector restricts a change in a trajectory of the charged particle beam and also selectively deflects a charged particle directed toward the charged particle source side from the sample side.

6. The charged particle beam apparatus according to claim 1,
wherein the controller obtains a sample potential on the basis of a movement direction of the charged particle directed toward the charged particle source side from the sample side, or a movement direction of the display object in the image.

7. The charged particle beam apparatus according to claim 1,
wherein the controller obtains a potential of the sample on the basis of a relationship between movement information of the charged particle directed toward the charged particle source side from the sample side or movement information of the display object in the image, and a sample potential.

8. A charged particle beam apparatus comprising:

a detector that detects a charged particle which is emitted from a sample due to irradiation with a charged particle beam emitted from a charged particle source, or detects a charged particle emitted when the charged particle emitted from the sample collides with a secondary charged particle generation member, wherein a sample potential is obtained on the basis of a deflector that deflects a charged particle directed toward the charged particle source side from the sample side, and a movement direction of the charged particle deflected by the deflector, or a movement direction of a display object in an image which is formed by using the charged particle.

9. The charged particle beam apparatus according to claim 8, the controller obtains a sample potential on the basis of a movement amount of the charged particle deflected by the deflector, or a movement amount of the display object in the image which is formed by using the charged particle.

10. A charged particle beam apparatus comprising:

a detector that detects a charged particle which is emitted from a sample due to irradiation with a charged particle beam emitted from a charged particle source, or detects a charged particle emitted when the charged particle emitted from the sample collides with a secondary charged particle generation member, wherein a first sample potential is obtained on the basis of a deflector that deflects a charged particle directed toward the charged particle source side from the sample side, and a movement amount of a charged particle deflected by the deflector, or a movement amount of a display object in an image which is formed by using the charged particle, and a second sample potential is obtained on the basis of a movement direction of the charged particle deflected by the deflector, or a movement direction of the display object in the image which is formed by using the charged particle.

* * * * *